(12) United States Patent
Song

(10) Patent No.: US 6,847,236 B1
(45) Date of Patent: Jan. 25, 2005

(54) BUFFER/VOLTAGE-MIRROR ARRANGEMENTS FOR SENSITIVE NODE VOLTAGE CONNECTIONS

(75) Inventor: Hongjiang Song, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/606,688

(22) Filed: Jun. 30, 2000

(51) Int. Cl.[7] .............................................. H03B 1/00
(52) U.S. Cl. ........................ 327/108; 327/112; 326/83
(58) Field of Search .......................... 327/50, 276, 278, 327/108, 436, 437, 581, 112, 427, 314, 325; 330/51, 262–264, 277, 310, 311; 326/56–58, 83, 87, 26, 27

(56) References Cited

U.S. PATENT DOCUMENTS

| | | | | | |
|---|---|---|---|---|---|
| 3,946,327 | A | * | 3/1976 | Hsu ............................. | 330/261 |
| 3,991,380 | A | * | 11/1976 | Pryor .......................... | 330/264 |
| 4,284,958 | A | * | 8/1981 | Pryor et al. .................. | 330/277 |
| 4,284,959 | A | * | 8/1981 | Heagerty et al. ............ | 330/277 |
| 4,333,057 | A | * | 6/1982 | Hoover ........................ | 330/264 |
| 5,070,259 | A | * | 12/1991 | Rempfer et al. .............. | 327/77 |
| 5,126,685 | A | * | 6/1992 | Platt et al. ................... | 330/277 |
| 5,220,216 | A | * | 6/1993 | Woo ............................ | 327/278 |
| 6,025,752 | A | * | 2/2000 | Zhou et al. ................... | 330/51 |

* cited by examiner

Primary Examiner—Long Nguyen
(74) Attorney, Agent, or Firm—Schwegman, Lundberg, Woessner & Kluth, P.A.

(57) ABSTRACT

The present invention is directed to buffer/voltage-mirror arrangements for sensitive node voltage connections.

19 Claims, 3 Drawing Sheets

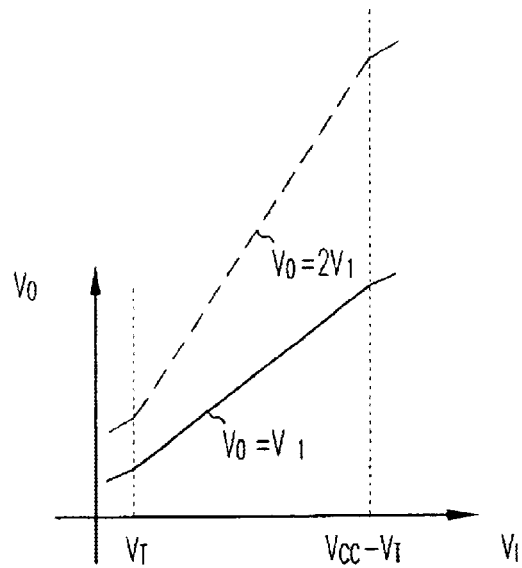
Fig. 3
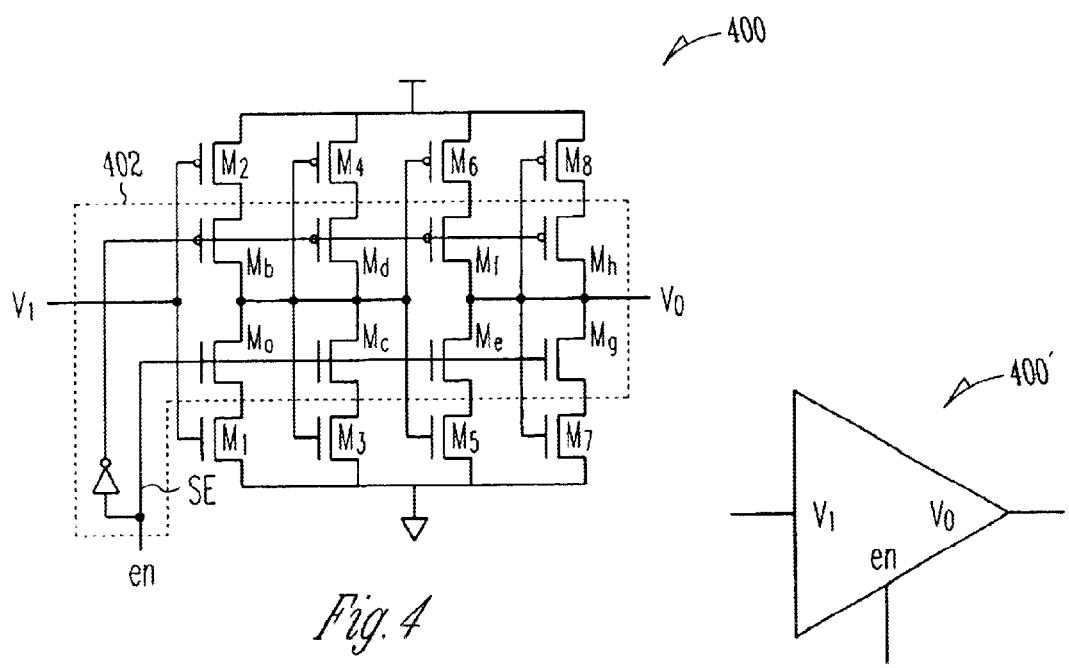
Fig. 4
Fig. 5

BUFFER/VOLTAGE-MIRROR ARRANGEMENTS FOR SENSITIVE NODE VOLTAGE CONNECTIONS

FIELD

The present invention is directed to buffer/voltage-mirror arrangements for sensitive node voltage connections.

BACKGROUND

Although a background as well as example embodiments of the present invention will be described in connection with an IC testing environment, practice of the invention is not limited thereto, i.e., the invention may be able to be practiced within other environments or for other types of uses.

Dramatic advancements in mixed-signal circuit during the past two decades has led to more stringent requirements and challenge for the mixed signal integrated circuit testing. The increasing testing cost and the difficult in detecting and isolating circuit faults due to the growing integration density and the variety natures of analog faults has been driving the recent development of more sophisticated automatic test equipment (ATE) and testing methodologies. However, one of the first obstacles the ATE testing has to overcome has been the front-end design of the testing equipment, that is how to pick-up the local signal information on the very tiny and sensitive integrated circuit device accurately and transport it safely to the off-chip testing equipment, without disturbing/influencing operation of the sensitive integrated circuit device. Usually signal detection (without disturbing) and conditioning (e.g., amplification, driving) have been the weakest link in the current mixed-signal integrated circuit testing and debugging processes.

More particularly, referencing FIG. 1, illustrated is a schematic diagram of an example system having a disadvantageous non-buffered arrangement for testing sensitive voltages within an integrated circuit (IC) 100. On IC 100, there is shown a miscellaneous circuit portion represented generically by the dashed portion C, and containing, for example, two internal nodes (e.g., probe pads) designated $V_1$ and $V_2$ and allowing access to internal voltages. Further shown, is an interconnection line L providing electrical connection between, for example, the $V_1$ connection point and an output probe pad $V_O$ provided at a periphery of the IC 100, such output probe pad $V_O$ allowing an ATE probe P to be connected thereto without physically contacting the actual sensitive circuit C.

A problem with the FIG. 1 arrangement is that a contemporary circuit C typically operates with very low voltages (e.g., 0.3 V), and thus has very sensitive internal nodes (e.g., $V_1$, $V_2$) which could easily be disturbed in electrical operation thereof by an impedance of the ATE probe. More particularly, it is well known that the ATE probe P has an unavoidable impedance Z associated therewith, and such impedance often is sufficient to disturb voltage levels at the internal node of which the probe is attempting to gain an accurate measurement. For example, a normal operating voltage at an internal node $V_1$ might be 0.18 V, but the impedance influence by a connected ATE probe P might cause an influence thereon an a resultant false reading of 0.21 V.

Accordingly, what is needed is an improved arrangement providing adequate buffering/isolation so as to allow a subject voltage to be accurately made available (e.g., for ATE testing) without a disturbance of the subject voltage. More particularly, needed is an improved arrangement for testing analog or low frequency signal levels within very sensitive internal nodes in mixed-signal integrated circuits.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 3 is an example input/output (I/O) voltage transfer function of the example buffer/voltage-mirror arrangement of FIG. 2;

FIG. 4 is an example buffer/voltage-mirror arrangement similar to that of FIG. 2, but further having a disabling/enabling switch;

FIG. 5 is an example alternative representation of the buffer/voltage-mirror arrangement of FIG. 4;

DETAILED DESCRIPTION

Figure 1:
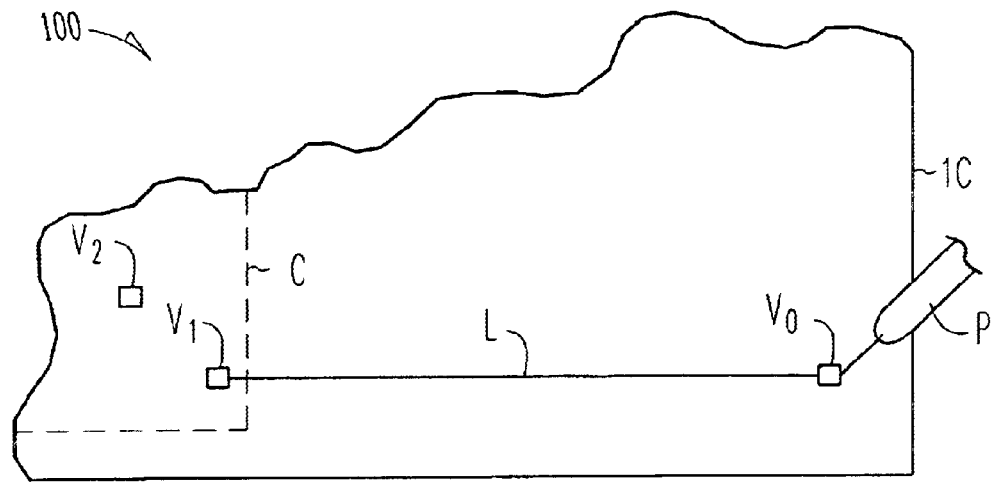
FIG. 1 is an example schematic diagram of an example system having a disadvantageous non-buffered arrangement shown in an environment of testing sensitive voltages within an integrated circuit (IC) according to the prior art.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Well known power/ground connections to ICs and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements is highly dependent upon the platform within which the present invention is to be implemented, ire., specifics should be well within purview of one skilled in the art. Where specific details (erg., circuits, flowcharts) are set forth in order to describe example embodiments of the invention, it should be apparent to one skilled in the art that the invention can be practiced without these specific details. Finally, it should be apparent that differing combinations of hard-wired circuitry and software instructions can be used to implement embodiments of the present invention, i.e., the present invention is not limited to any specific combination of hardware and software.

In the following example embodiment, an on-chip mixed signal design-for-testability (DFT) circuit is proposed. This circuit is aimed at providing the observeability of very sensitive internal nodes in the mixed signal integrated circuits. It is based on a class AB CMOS voltage mirror architecture.

Figure 2:
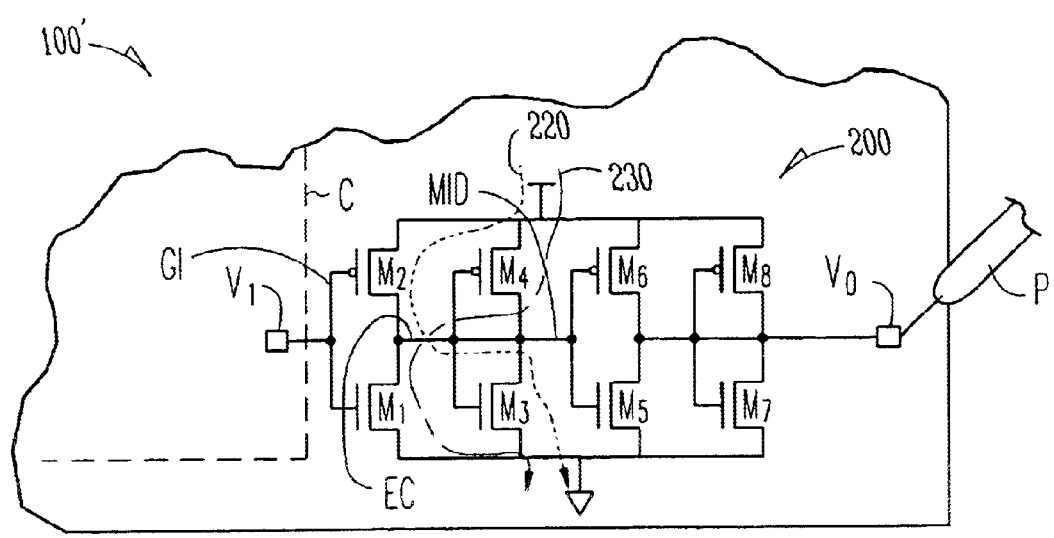
FIG. 2 is an example schematic diagram of an example system having an advantageous buffer/voltage-mirror arrangement shown in an environment of testing sensitive voltages within an IC.

More particularly, referencing FIG. 2, the IC 100' now shows an example buffer/voltage-mirror arrangement 200 provided electrically interconnected between the internal node $V_1$ (serving as input voltage $V_I$) and the output node $V_O$. More particularly, the buffer/voltage-mirror arrangement 200 has two stages, each constructed of an example basic building block. More specifically, transistors $M_1$, $M_2$, $M_3$, $M_4$ and the interconnections associated therewith represent a first stage, whereas transistors $M_5$, $M_6$, $M_7$, $M_8$ and the interconnections associated therewith represent a second stage. For the sake of brevity, the construction of only the first of such stages will be discussed, with such description applying equally as well to the second stage.

More particularly, shown in FIG. 2 is a first stage including electrically-parallel branches of a first transistor $M_1$ connected in series with a second transistor $M_2$, and a third transistor $M_3$ connected in series with a fourth transistor $M_4$, the second $M_2$ and fourth $M_4$ transistors being of an inverse type to that of the first $M_1$ and third $M_3$ transistors. A gate interconnection GI electrically connects gates of the first $M_1$ and second $M_2$ transistors to one another. Further, an intermediate electrical connection EC connects all of the gates of the third $M_3$ and fourth $M_4$ transistors, an intermediate point between the first $M_1$ and second $M_2$ transistors and an intermediate point between the third $M_3$ and fourth $M_4$, to one another. The gate interconnection GI of the first stage represents an input.*

Whereas the transistors $M_1$, $M_2$, $M_3$, $M_4$ and associated connections represent a first stage, the transistors $M_5$, $M_6$, $M_7$ and $M_8$ and associated connections represent a second stage, i.e., the first and second stages are joined at a midpoint MID. That is, the intermediate electrical connection EC of a preceding stage is electrically connected to a gate interconnection GI of a succeeding stage. Finally, the intermediate electrical connection EC of a final stage represents an output. It is important to note that the output node $V_O$ is not directly connected to the input node $V_I$, i.e., the transistors provide buffering therebetween. Accordingly, due to the isolation provided by the FIG. 2 circuit 200, any impedance of the probe P will not affect operation of the circuit C.

It should be noted that while in FIG. 2 and other FIGS. the inverse-type switch transistors are illustrated as being positioned similarly in each stage, it should be apparent that such configuration is not necessary to practice of the invention, i.e., the positions of the inverse type and non-inverse type switch transistors can be easily exchanged with one another within any of the stages. Further, while the transistors are described as being CMOS devices, practice of the invention may be made also with MOS transistors as well as other types of transistors.

The FIG. 2 buffer/voltage-mirror arrangement is adapted to cause an output voltage on the output (e.g., $V_O$) to mirror an input voltage on the input (e.g., $V_I$) by a predetermined factor. In many instances, the predetermined factor will be a "+1" in order to provide a unity gain, i.e., such that the output voltage $V_O$ exactly mirrors the input voltage $V_I$, i.e., $V_O=V_I$. That is, the device sizes in this circuit are such selected that $(W/L)_1=(W/L)_3$, $(W/L)_2=(W/L)_4$, $(W/L)_5=(W/L)_7$, $(W/L)_6=(W/L)_8$. It can be derived that this circuit realizes a unity-gain buffering function (FIG. 3). In certain applications, varying the ratio of the matched device pairs can also provide desired non-unity gain values.

That is, referencing FIG. 3 which shows a plot of an I/O voltage transfer function of the FIG. 2 voltage mirror, a first solid line plot illustrates a situation where there is unity gain, i.e., where $V_O=V_I$. It can be seen within FIG. 3 that there is a region of linearity within the range between the input voltages $V_T$ and $V_{CC}-V_T$. That is, outside of such range the transistors no longer provide a linear voltage transfer function. FIG. 3 also illustrates another situation where the FIG. 2 arrangement is designed such that a predetermined factor equals a numerical "+2", such that $V_O=2V_I$. Accordingly, the FIG. 2 arrangement can be designed to provide a predetermined amplification of an input voltage.

Next, an operation of the example FIG. 2 arrangement will be described. More specifically, if a "high" input voltage is present at an input node $V_I$, such will be applied to the gates of transistors $M_1$ and $M_2$ through the gate interconnection GI. Such high voltage will cause the transistor $M_2$ to turn off, whereas transistor $M_1$ will be turned on. The FIG. 2 arrangement is constructed such that this in turn causes the transistor $M_4$ to be turned on, while the transistor $M_3$ is turned off. Accordingly, as a result of a high voltage being applied at the input node $V_I$, a current will flow through the transistors $M_4$ and $M_1$ as shown by the long/single-short dashed line 230. In contrast, when a "low" voltage is applied to the input node $V_I$, the transistors $M_2$ and $M_3$ will be turned on causing a current to flow therethrough as indicated by the long/double-short dashed line 220, whereas the transistors $M_1$ and $M_4$ will be turned off. Operation of the second stage including the transistors $M_5$, $M_6$, $M_7$, $M_8$ is analogous to the first stage, so redundant discussion thereof is omitted for sake of brevity.

The first stage of the transistors $M_1$, $M_2$, $M_3$, $M_4$ actually causes an inverted voltage to appear at the midpoint MID, i.e., if a "high" voltage is applied to the input node $V_I$, a "low" voltage will be "mirrored" at the midpoint MID, and vice versa when a "low" voltage is applied. Accordingly, it can be seen that if a single stage is used, the predetermined factor would be a negative number (e.g., "−1") corresponding to the voltage inversion. The same applies for any odd-numbered stage in a series of stages, i.e., an voltage inversion will appear.

Further important features to note with respect to the FIG. 2 example buffer/voltage-mirror arrangement is that such circuit can be designed to minimize influences thereof on operation of the subject circuit C, while at the same time can be designed to provide increased load capacity which may be required/useful for ATE. More particularly, in practice, the input CMOS device stage ($M_1$, $M_2$, $M_3$, $M_4$) is usually selected to be small to minimize the influence of the DFT circuit to node voltage under test. Accordingly, ones of the first, second, third and fourth transistors of an input stage of the buffer/voltage-mirror arrangement are smaller in size than other ones of said first, second, third and fourth transistors of other stages so as to minimize an influence on any input circuit. In contrast, a larger output stage ($M_5$, $M_6$, $M_7$, $M_8$) is used to increase the drive capability of the DFT cell for the down stream capacitive loads (probe pad, ATE probe, etc.). That is, first, second, third and fourth transistors of an output stage of the buffer/voltage-mirror arrangement are larger in size than other ones of said first, second, third and fourth transistors of other stages so as to increase a driving capacity.

An advantage of the FIG. 2 example buffer/voltage-mirror circuit is that it is very easy to design and implement in a semiconductor IC, and such does not require excessive semiconductor real estate. Further, if the circuit is laid out on the semiconductor die such that the transistor devices are geographically close to one another, then all such transistors will be subjected to substantially the same semiconductor processing and local environment leading to the advantage that the various transistor devices can be easily matched to one another. Practice of the present invention may also be made with discreet (as opposed to semiconductor) circuits. However, such would require matching of components, with any degree of mismatching affecting an accuracy of the buffer/voltage-mirror circuit.

A disadvantage of the FIG. 2 arrangement is continuous power consumption. More particularly, the FIG. 2 buffer/voltage-mirror circuit 200 is always biased on, and accordingly, such circuit 200 continuously consumes power which adds to excessive IC heating and shorter battery life. Shown in FIG. 4 is a more energy-practical single test point cell (STPC) adapted from the basic voltage-mirror arrangement. In this DFT cell, an enable pin "en" is introduced which can disable the cell when the cell is not in use. Such an operation mode eliminates the power penalty of the DFT cell in normal chip operation and makes the circuit fully compatible to IDDq testing techniques.

More particularly, turning now to description of the FIG. 4 circuit 400 and comparing the same to the FIG. 2 circuit 200, added is an additional switch arrangement 402 sandwiched between the original transistors. For sake of differentiation, switch transistors are designated by an alphabetical subscript (e.g., $M_a$), whereas original buffer/voltage-mirror transistors remain designated with numerical subscripts (e.g., $M_1$). The switch 402 is for selectively enabling/disabling at least one of the stages and in construction includes, for example, the following. A series connection of a fifth transistor $M_a$ and a sixth transistor $M_b$ is electrically connected between the first $M_1$ and second $M_2$ transistors. Likewise, a series connection of a seventh transistor $M_c$ and an eighth transistor $M_d$ is electrically connected between the third $M_3$ and fourth $M_4$ transistors. The sixth $M_b$ and eighth $M_d$ transistors are of an inverse type to that of the fifth $M_a$ and seventh $M_c$ transistors. It should be noted that while in the FIG. 4 and other FIGS. the inverse-type switch transistors are illustrated as being next to the inverse type buffer/voltage-mirror transistors, it should be apparent that such configuration is not necessary to practice of the invention, i.e., the positions of the inverse type and non-inverse type switch transistors can be easily exchanged with one another. For sake of brevity, again, only the switch transistors related to the first stage are being discussed, i.e., it is believed to be well within the view of one skilled in the art to understand operation of the second stage switch transistors $M_e$, $M_f$, $M_g$, and $M_h$.

Further shown within FIG. 4 is a switch enabling interconnection SE electrically connected to the gates of the fifth $M_a$ and seventh $M_c$ transistors and through an inverter to gates of the sixth $M_b$ and eighth $M_d$ transistors, and arranged to receive the enabling input "en". An intermediate point between the first $M_1$ and second $M_2$ transistors likewise serves as an intermediate point between the fifth $M_a$ and sixth $M_b$ transistors, and the intermediate point between the third $M_3$ and fourth $M_4$ transistors also serves as an intermediate point between the seventh $M_c$ and eighth $M_d$ transistors.

From analyzing the FIG. 4 arrangement it should be apparent that if an appropriate disabling signal is applied to the switch enabling interconnection SE, then all of the switch transistors can be effectively disabled to prevent current flow through the circuit 400, thus resulting in power and heat savings. Likewise, if an appropriate enabling input is applied to bias all of the switch transistors ON, then current is allowed to flow through the circuit 400, thus enabling the same. FIG. 5 is an example alternative representation of the buffer/voltage-mirror arrangement of FIG. 4.

Figure 6:
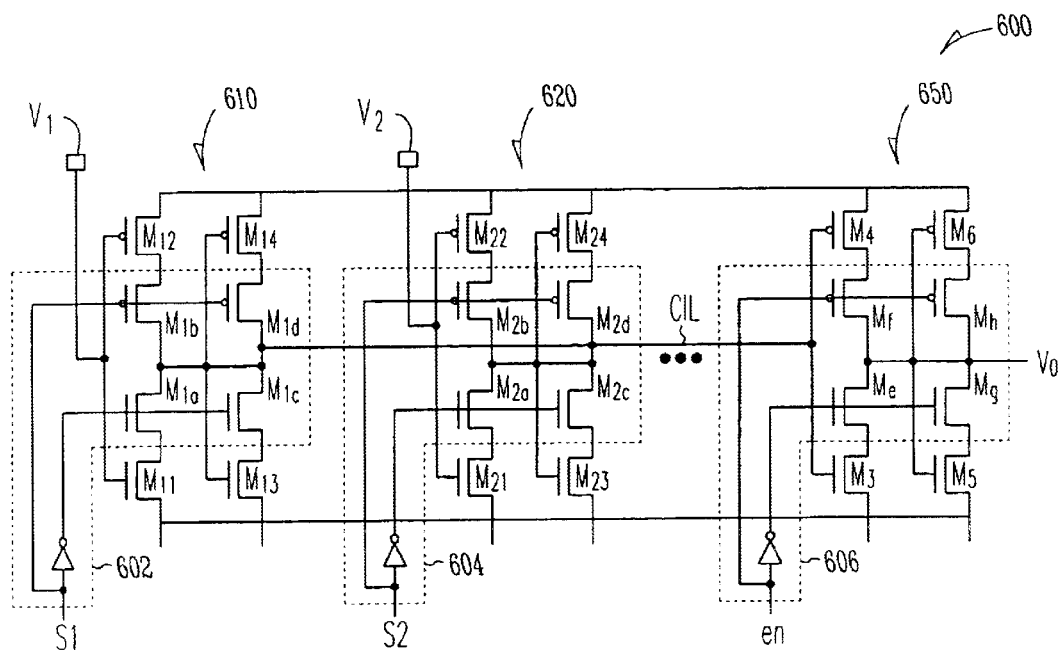
FIG. 6 is an example buffer/voltage-mirror arrangement similar to that of FIG. 4, but further having a plurality of selectable disabling/enabling switches enabling connection to any of a plurality of connection points.
Figure 7:
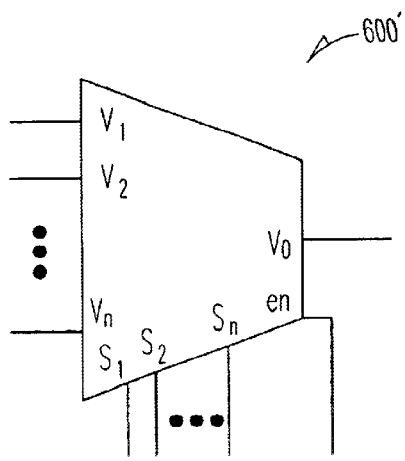
FIG. 7 is an example alternative representation of the buffer/voltage-mirror arrangement of FIG. 6.

A multiple test points cell (MTPC) can also adapted from the basic architecture (FIG. 6). In the cell, several node voltage of interest in the mixed-signal circuit chip can be tested use a single MTPC, and all measured voltages are transported off-chip from a single output port through multiplexing. More particularly, FIG. 6 is an example buffer/voltage-mirror arrangement similar to that of FIG. 4, but further having a plurality of selectable enabling/disabling switches which allow disabling/enabling of any of a plurality of stages and thus connection to any of a plurality of connection points. More particularly, returning momentarily to FIG. 1, FIG. 1 shows a plurality of internal nodes $V_1$ and $V_2$ suitable for testing. Returning to FIG. 6, shown is a circuit 600 including a plurality of stages 610, 620, . . . 650. The stage 610 is connectable to the first internal node $V_1$, and includes a disabling/enabling switch 602, the stage 620 is interconnectable to the second internal node $V_2$ and includes a disabling/enabling switch 604, and so on, with a final stage 650 including a disabling/enabling switch 606. At any given time, any one of the stages 610, 620, . . . can be enabled and operate in conjunction with an enabled final stage 650, thus to operate similarly to an enabled FIG. 4 circuit 400. A common interconnection CIL connected to each of the stages is used to forward feed an output from any one of the stages 610, 620, . . . to the final stage 650.

The above arrangements have applications in a wide variety of mixed signal integrated circuit testing, including the voltage measurement of the extremely sensitive internal node of the VLSI/ULSI mixed signal integrated circuits (such as the VCO control node voltage of an analog PLL), the on-chip charge measurement (such as charge injection measurement in most switch-capacitor CMOS, A/D, D/A, and filter circuits), and the on-chip weak current (such as leakage current) measurement, etc. This circuit can be used as stand alone interface between the node under test and the test pad for silicon debug or use in chain in cooperated with the ATE and most current test methodologies for various manufacture testing.

The DFT circuit proposed is fully digital process compatible and highly scalable. It is self-biased, easy to design and very robust to use. Its small area, performance and avoidance of power penalties also make it especially suitable for VLSI/ULSI mixed-signal circuit integration. This capability combined with leading edge digital design/manufacture/testing technologies and the mixed signal process technology will allow development of competitive products in the mixed signal market.

Reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

That is, as mentioned previously, practice of the invention is not limited to connection with an IC testing environment. For example, practice of the invention has a wide range of uses, e.g.: could be used to provide buffering/connecting between various parts of an IC circuit; could be used as a selectably enabling/disabling arrangement to customize (i.e., activate) IC features, for example, if a premium price is paid allowing access to such special features.

What is claimed is:

1. A buffer/voltage-mirror arrangement comprising:
a plurality of stages, each comprising:
electrically-parallel branches of a first transistor connected in series with a second transistor, and a third transistor connected in series with a fourth transistor said second and fourth transistors being of an inverse type to that of said first and third transistors, a gate interconnection electrically connecting gates of said first and second transistors to one another, and an intermediate electrical connection connecting all of the gates of said third and fourth transistors, an intermediate point between said first and second transistors and an intermediate point between said third and fourth transistors to one another;
wherein said gate interconnection of a first stage represents an input, wherein said intermediate electrical connection of a preceding stage is electrically connected to said gate interconnection of a succeeding stage, and said intermediate electrical connection of a final stage represents an output, and wherein said buffer/voltage-mirror arrangement is adapted to cause an output voltage on said output to mirror an input voltage on said input by a predetermined factor;
at least one stage of said plurality of stages comprising a switch for selectably enabling/disabling said at least one stage, said switch comprising:
a series connection of a fifth transistor and a sixth transistor electrically connected between said first and second transistors, and a series connection of a seventh transistor and an eighth transistor electrically connected between said third and fourth transistors, said sixth and eighth transistors being of an inverse type to that of said fit and seventh transistors, a switch enabling interconnection electrically connected to gates of said fifth and seventh transistors and connected through an inverter to gates of said sixth and eighth transistors, with said intermediate point between said first and second transistors likewise serving as an intermediate point between said fifth and sixth transistors, and with said intermediate point between said third and fourth transistors likewise serving as an intermediate point between said seventh and eighth transistors.

2. A buffer/voltage-mirror arrangement as claimed in claim 1, further comprising:
at least a sub-plurality of said plurality of stages comprising said switch; and
wherein at least two stages of said at least a sub-plurality have said gate interconnection arranged to accept a mutually different input from one another.

3. A buffer/voltage-mirror arrangement as claimed in claim 1, wherein said first and third transistors have width-to-length ratios which are substantially equal to one another, and said second and fourth transistors have width-to-length ratios which are substantially equal to one another.

4. A device comprising:
a buffer/voltage-mirror arrangement comprising:
a plurality of stages, each comprising:
electrically-parallel branches of a first transistor connected in series with a second transistor, and a third transistor connected in series with a fourth transistor, said second and fourth transistors being of an inverse type to that of said first and third transistors, a gate interconnection electrically connecting gates of said first and second transistors to one another, and an intermediate electrical connection connecting all of the gates of said third and fourth transistors, an intermediate point between said first and second transistors and an intermediate point between said third and fourth transistors to one another;
wherein said gate interconnection of a first stage represents an input, wherein said intermediate electrical connection of a preceding stage is electrically connected to said gate interconnection of a succeeding stage, and said intermediate electrical connection of a final stage represents an output, and wherein said buffer/voltage-mirror arrangement is adapted to cause an output voltage on said output to mirror an input voltage on said input by a predetermined factor;
at least one stage of said plurality of stages comprising a switch for selectably enabling/disabling said at least one stage, said switch comprising:
a series connection of a fifth transistor and a sixth transistor electrically connected between said first and second transistors, and a series connection of a seventh transistor and an eighth transistor electrically connected between said third and fourth transistors, said sixth and eighth transistors being of an inverse type to that of said fifth and seventh transistors, a switch enabling interconnection electrically connected to gates of said fifth and seventh transistors and connected through an inverter to gates of said sixth and eighth transistors, with said intermediate point between said first and second transistors likewise serving as an intermediate point between said fifth and sixth transistors, and with said intermediate point between said third and fourth transistors likewise serving as an intermediate point between said seventh and eighth transistors.

5. A device as claimed in claim 4, further comprising:
at least a sub-plurality of said plurality of stages comprising said switch; and
wherein at least two stages of said at least a sub-plurality have said gate interconnection arranged to accept a mutually different input from one another.

6. A device as claimed in claim 4, wherein said first and third transistors have width-to-length ratios which are substantially equal to one another, and said second and fourth transistors have width-to-length ratios which are substantially equal to one another.

7. An integrated circuit comprising:

a buffer/voltage-mirror arrangement comprising:

a plurality of stages, each comprising:

electrically-parallel branches of a first transistor connected in series with a second transistor, and a third transistor connected in series with a fourth transistor, said second and fourth transistors being of an inverse type to that of said first and third transistors, a gate interconnection electrically connecting gates of said first and second transistors to one another, and an intermediate electrical connection connecting all of the gates of said third and fourth transistors, an intermediate point between said first and second transistors and an intermediate point between said third and fourth transistors to one another;

wherein said gate interconnection of a first stage represents an input, wherein said intermediate electrical connection of a preceding stage is electrically connected to said gate interconnection of a succeeding stage, and said intermediate electrical connection of a final stage represents an output, and wherein said buffer/voltage-mirror arrangement is adapted to cause an output voltage on said output to mirror an input voltage on said input by a predetermined factor;

at least one stage of said plurality of stages comprising a switch for selectably enabling/disabling said at least one stage, said switch comprising:

a series connection of a fifth transistor and a sixth transistor electrically connected between said first and second transistors, and a series connection of a seventh transistor and an eighth transistor electrically connected between said third and fourth transistors, said sixth and eighth transistors being of an inverse type to that of said fifth and seventh transistors, a switch enabling interconnection electrically connected to gates of said fifth and seventh transistors and connected through an inverter to gates of said sixth and eighth transistors, with said intermediate point between said first and second transistors likewise serving as an intermediate point between said fifth and sixth transistors, and with said intermediate point between said third and fourth transistors likewise serving as an intermediate point between said seventh and eighth transistors.

8. An integrated circuit as claimed in claim 7, further comprising:

at least a sub-plurality of said plurality of stages comprising said switch; and wherein at least two stages of said at least a sub-plurality have said gate interconnection arranged to accept a mutually different input from one another.

9. An integrated circuit as claimed in claim 7, wherein said first and third transistors have width-to-length ratios which are substantially equal to one another, and said second and fourth transistors have width-to-length ratios which are substantially equal to one another.

10. A buffer/voltage-mirror arrangement comprising:

a plurality of stages, each including:

electrically-parallel branches of a first transistor connected in series with a second transistor, and a third transistor connected in series with a fourth transistor, said second and fourth transistors being of an inverse type to that of said first and third transistors, where said first and third transistors are substantially matched and said second and fourth transistors are substantially matched, a gate interconnection electrically connecting gates of said first and second transistors to one another, and an intermediate electrical connection directly connecting all of the gates of said third and fourth transistors, an intermediate point between said first and second transistors and an intermediate point between said third and fourth transistors to one another;

at least one stage of said plurality of stages comprising a switch for selectably enabling/disabling said at least one stage, said switch including:

a series connection of a fifth transistor and a sixth transistor electrically connected between said first and second transistors, and a series connection of a seventh transistor and an eighth transistor electrically connected between said third and fourth transistors, said sixth and eighth transistors being of an inverse type to that of said fifth and seventh transistors, a switch enabling interconnection electrically connected to gates of said fifth and seventh transistors and connected through an inverter to gates of said sixth and eighth transistors, with said intermediate point between said first and second transistors likewise serving as an intermediate point between said fifth and sixth transistors, and with said intermediate point between said third and fourth transistors likewise serving as an intermediate point between said seventh and eighth transistors, and wherein said gate interconnection of a first stage represents an input, wherein said intermediate electrical connection of a preceding stage is electrically connected to said gate interconnection of a succeeding stage, and said intermediate electrical connection of a final stage represents an output, and wherein said buffer/voltage-mirror arrangement is adapted to cause an output voltage on said output to mirror an input voltage on said input by a predetermined factor.

11. A buffer/voltage-mirror arrangement as claimed in claim 10, further comprising:

at least a sub-plurality of said plurality of stages comprising said switch; and wherein at least two stages of said at least a sub-plurality have said gate interconnection arranged to accept a mutually different input from one another.

12. A device comprising:

a buffer/voltage-mirror arrangement including:

a plurality of stages, each including:

electrically-parallel branches of a first transistor connected in series with a second transistor, and a third transistor connected in series with a fourth transistor, said second and fourth transistors being of an inverse type to that of said first and third transistors, where said first and third transistors are substantially matched and said second and fourth transistors are substantially matched, a gate interconnection electrically connecting gates of said first and second transistors to one another, and an intermediate electrical connection directly connecting all of the gates of said third and fourth transistors, an intermediate point between said first and second transistors and an intermediate point between said third and fourth transistors to one another;

at least one stage of said plurality of stages comprising a switch for selectably enabling/disabling said at least one stage, said switch including:

a series connection of a fifth transistor and a sixth transistor electrically connected between said first and second transistors, and a series connection of a seventh transistor and an eighth transistor electrically connected between said third and fourth transistors, said sixth and eighth transistors being of an inverse type to that of said fifth and seventh transistors, a switch enabling interconnection electrically connected to gates of said fifth and seventh transistors and connected through an inverter to gates of said sixth and eighth transistors, with said intermediate point between said first and second transistors likewise serving as an intermediate point between said fifth and sixth transistors, and with said intermediate point between said third and fourth transistors likewise serving as an intermediate point between said seventh and eighth transistors; and wherein said gate interconnection of a first stage represents an input wherein said intermediate electrical connection of a preceding stage is electrically connected to said gate interconnection of a succeeding stage and said intermediate electrical connection of a final stage represents an output, and wherein said buffer/voltage-mirror arrangement is adapted to cause an output voltage on said output to minor an input voltage on said input by a predetermined factor.

13. A device as claimed in claim 12, further comprising:
at least a sub-plurality of said plurality of stages comprising said switch; and
wherein at least two stages of said at least a sub-plurality have said gate interconnection arranged to accept a mutually different input from one another.

14. An integrated circuit comprising:
a buffer/voltage-mirror arrangement including:
a plurality of stages, each including:
electrically-parallel branches of a first transistor connected in series with a second transistor, and a third transistor connected in series with a fourth transistor, said second and fourth transistors being of an inverse type to that of said first and third transistors, where said first and third transistors are substantially matched and said second and fourth transistors are substantially matched, a gate interconnection electrically connecting gates of said first and second transistors to one another, and an intermediate electrical connection directly connecting all of the gates of said third and fourth transistors, an intermediate point between said first and second transistors and an intermediate point between said third and fourth transistors to one another;
at least one stage of said plurality of stages comprising a switch for selectably enabling/disabling said at least one stage, said switch including:
a series connection of a fifth transistor and a sixth transistor electrically connected between said first and second transistors, and a series connection of a seventh transistor and an eighth transistor electrically connected between said third and fourth transistors, said sixth and eighth transistors being of an inverse type to that of said fifth and seventh transistors, a switch enabling interconnection electrically connected to gates of said fifth and seventh transistors and connected through an inverter to gates of said sixth and eighth transistors, with said intermediate point between said first and second transistors likewise serving as an intermediate point between said fifth and sixth transistors, and with said intermediate point between said third and fourth transistors likewise serving as an intermediate point between said seventh and eighth transistors; and wherein said gate interconnection of a first stage represents an input, wherein said intermediate electrical connection of a preceding stage is electrically connected to said gate interconnection of a succeeding stage, and said intermediate electrical connection of a final stage represents an output, and wherein said buffer/voltage-mirror arrangement is adapted to cause an output voltage on said output to mirror an input voltage on said input by a predetermined factor.

15. An integrated circuit as claimed in claim 14, further comprising:
at least a sub-plurality of said plurality of stages comprising said switch; and
wherein at least two stages of said at least a sub-plurality have said gate interconnection arranged to accept a mutually different input from one another.

16. A buffer/voltage-mirror arrangement comprising:
a plurality of stages, each including:
electrically-parallel branches of a first transistor connected in series with a second transistor, and a third transistor connected in series with a fourth transistor, said second and fourth transistors being of an inverse type to that of said first and third transistors, where said first and third transistors are substantially matched and said second and fourth transistors are substantially matched, a gate interconnection electrically connecting gates of said first and second transistors to one another, and an intermediate electrical connection directly connecting all of the gates of said third and fourth transistors, an intermediate point between said first and second transistors and an intermediate point between said third and fourth transistors to one another;
wherein said gate interconnection of a first stage represents an input, wherein said intermediate electrical connection of a preceding stage is electrically connected to said gate interconnection of a succeeding stage, and said intermediate electrical connection of a final stage represents an output, and wherein said buffer/voltage-mirror arrangement is adapted to cause an output voltage on said output to mirror an input voltage on said input by a predetermined factor; and
wherein said first and third transistors have width-to-length ratios which are substantially equal to one another, and said second and fourth transistors have width-to-length ratios which are substantially equal to one another.

17. A device comprising:
a buffer/voltage-mirror arrangement including:
a plurality of stages, each including:
electrically-parallel branches of a first transistor connected in series with a second transistor, and a third transistor connected in series with a fourth transistor, said second and fourth transistors being of an inverse type to that of said first and third transistors, where said first and third transistors are substantially matched and said second and fourth transistors are substantially matched, a gate interconnection electrically connecting gates of said first and second transistors to one another, and an intermediate electrical connection directly connecting all of the gates of said third and fourth transistors, an intermediate point between said first and second transistors and an intermediate point between said third and fourth transistors to one another;
wherein said gate interconnection of a first stage represents an input, wherein said intermediate electrical connection of a preceding stage is electrically connected to said gate interconnection of a succeeding stage, and said intermediate electrical connection of a final stage represents an output, and wherein said buffer/voltage-mirror arrangement is adapted to cause an output voltage on said output to mirror an input voltage on said input by a predetermined factor; and wherein said first and third transistors have width-to-length ratios which are substantially equal to one another, and said second and fourth transistors have width-to-length ratios which are substantially equal to one another.

18. An integrated circuit comprising:

a buffer/voltage-mirror arrangement including:

a plurality of stages, each including:

electrically-parallel branches of a first transistor connected in series with a second transistor, and a third transistor connected in series with a fourth transistor, said second and fourth transistors being of an inverse type to that of said first and third transistors, where said first and third transistors are substantially matched and said second and fourth transistors are substantially matched, a gate interconnection electrically connecting gates of said first and second transistors to one another, and an intermediate electrical connection directly connecting all of the gates of said third and fourth transistors, an intermediate point between said first and second transistors and an intermediate point between said third and fourth transistors to one another;

wherein said gate interconnection of a first stage represents an input, wherein said intermediate electrical connection of a preceding stage is electrically connected to said gate interconnection of a succeeding stage, and said intermediate electrical connection of a final stage represents an output, and where in said buffer/voltage-mirror arrangement is adapted to cause an output voltage on said output to mirror an input voltage on said input by a predetermined factor; and wherein said first and third transistors have width-to-length ratios which are substantially equal to one another, and said second and fourth transistors have width-to-length ratios which are substantially equal to one another.

19. A buffer/voltage-mirror arrangement comprising:

a plurality of stages, each including:

electrically-parallel branches of a first transistor connected in series with a second transistor, and a third transistor connected in series with a fourth transistor, said second and fourth transistors being of an inverse type to that of said first and third transistors, where said first and third transistors are substantially matched and said second and fourth transistors are substantially matched, a gate interconnection electrically connecting gates of said first and second transistors to one another, and an intermediate electrical connection directly connecting all of the gates of said third and fourth transistors, an intermediate point between said first and second transistors and an intermediate point between said third and fourth transistors to one another;

wherein said gate interconnection of a first stage represents an input, wherein said intermediate electrical connection of a preceding stage is electrically connected to said gate interconnection of a succeeding stage, and said intermediate electrical connection of a final stage represents an output, and wherein said buffer/voltage-mirror arrangement is adapted to cause an output voltage on said output to mirror an input voltage on said put by a predetermined factor of substantially +1; and wherein said first and third transistors have width-to-length ratios which are substantially equal to one another, and said second and fourth transistors have width-to-length ratios which are substantially equal to one another.

* * * * *

UNITED STATES PATENT AND TRADEMARK OFFICE
CERTIFICATE OF CORRECTION

PATENT NO. : 6,847,236 B1
APPLICATION NO. : 09/606688
DATED : January 25, 2005
INVENTOR(S) : Song It is certified that error appears in the above-identified patent and that said Letters Patent is hereby corrected as shown below:

Column 7,
Line 58, after "said" delete "fit" and insert -- fifth --.

Column 10,
Line 28, after "transistors" delete "," and insert -- ; --.

Column 11,
Line 17, after "input" insert -- , --.
Line 20, after "stage" insert -- , --.
Line 23, delete "minor" and insert -- mirror --.

Column 14,
Line 31, delete "put" and insert -- input --.

Signed and Sealed this

Twentieth Day of June, 2006

JON W. DUDAS
*Director of the United States Patent and Trademark Office*